(12) United States Patent
Nonaka et al.

(10) Patent No.: US 10,253,429 B2
(45) Date of Patent: Apr. 9, 2019

(54) METHOD FOR MANUFACTURING EPITAXIAL SILICON WAFER

(71) Applicant: SUMCO CORPORATION, Tokyo (JP)

(72) Inventors: Naoya Nonaka, Tokyo (JP); Tadashi Kawashima, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/568,158

(22) PCT Filed: Apr. 5, 2016

(86) PCT No.: PCT/JP2016/061088
§ 371 (c)(1),
(2) Date: Oct. 20, 2017

(87) PCT Pub. No.: WO2016/174997
PCT Pub. Date: Nov. 3, 2016

(65) Prior Publication Data
US 2018/0087184 A1 Mar. 29, 2018

(30) Foreign Application Priority Data

Apr. 30, 2015 (JP) .................................. 2015-092805

(51) Int. Cl.
*H01L 21/324* (2006.01)
*C30B 25/18* (2006.01)
(Continued)

(52) U.S. Cl.
CPC ............ *C30B 25/186* (2013.01); *C30B 25/20* (2013.01); *C30B 29/06* (2013.01); *C30B 33/02* (2013.01);
(Continued)

(58) Field of Classification Search
CPC ......... H01L 21/02532; H01L 21/02381; H01L 21/02658; H01L 21/02019; C30B 25/02
See application file for complete search history.

(56) References Cited

U.S. PATENT DOCUMENTS 8,956,927 B2 2/2015 Kawashima et al.
9,425,264 B2 8/2016 Kawashima et al.
(Continued)

FOREIGN PATENT DOCUMENTS

JP 54-141560 A 11/1979
JP 4-72718 A 3/1992
(Continued)

OTHER PUBLICATIONS

Official Communication issued in WIPO PCT Patent Application No. PCT/JP2016/061088, dated Jun. 14, 2016.
(Continued)

*Primary Examiner* — Matthew J Song
(74) *Attorney, Agent, or Firm* — Greenblum & Bernstein, P.L.C.

(57) ABSTRACT

A method includes: a step of forming an oxide film on a backside of a silicon wafer; a step of removing the oxide film present at an outer periphery of the silicon wafer; a step of argon annealing in which a heat treatment is performed in an argon gas atmosphere; and a step of forming an epitaxial film on a surface of the silicon wafer, the step of forming the epitaxial film including: a step of pre-baking in which the silicon wafer is subjected to a heat treatment in an gas atmosphere containing hydrogen and hydrogen chloride to etch an outer layer of the silicon wafer; and a step of growing the epitaxial film on the surface of the silicon wafer.

5 Claims, 6 Drawing Sheets

(51) Int. Cl.
*C30B 29/06* (2006.01)
*C30B 33/02* (2006.01)
*C30B 33/12* (2006.01)
*H01L 21/02* (2006.01)
*C30B 25/20* (2006.01)

(52) U.S. Cl.
CPC ........ *C30B 33/12* (2013.01); *H01L 21/02019* (2013.01); *H01L 21/0262* (2013.01); *H01L 21/02381* (2013.01); *H01L 21/02532* (2013.01); *H01L 21/02576* (2013.01); *H01L 21/02658* (2013.01); *H01L 21/324* (2013.01)

(56) References Cited

U.S. PATENT DOCUMENTS

| | | | |
|---|---|---|---|
| 9,755,022 | B2 | 9/2017 | Kawashima et al. |
| 2005/0035349 | A1 | 2/2005 | Umeno et al. |
| 2007/0062438 | A1 | 3/2007 | Schauer et al. |
| 2007/0066036 | A1* | 3/2007 | Schauer ................ C30B 25/02 438/478 |
| 2007/0298591 | A1* | 12/2007 | Cha .................... H01L 21/0245 438/478 |
| 2008/0118712 | A1 | 5/2008 | Schauer et al. |
| 2014/0001605 | A1* | 1/2014 | Kawashima ........ H01L 21/3221 257/629 |
| 2016/0102418 | A1 | 4/2016 | Narushima et al. |

FOREIGN PATENT DOCUMENTS

| | | |
|---|---|---|
| JP | 2003-273063 A | 9/2003 |
| JP | 2004-91234 A | 3/2004 |
| JP | 2004-363510 A | 12/2004 |
| JP | 2007-88469 A | 4/2007 |
| JP | 2011-114210 A | 6/2011 |
| JP | 2011-142327 A | 7/2011 |
| JP | 2012-164814 A | 8/2012 |
| JP | 2014-11293 A | 1/2014 |
| WO | 2014/175120 A1 | 4/2014 |

OTHER PUBLICATIONS

Official Communication issued in WIPO PCT Patent Application No. PCT/JP2016/061088, dated Oct. 31, 2017.
Office Action issued for the corresponding Japanese Patent Application No. 2015-092805 dated Aug. 7, 2018.

* cited by examiner

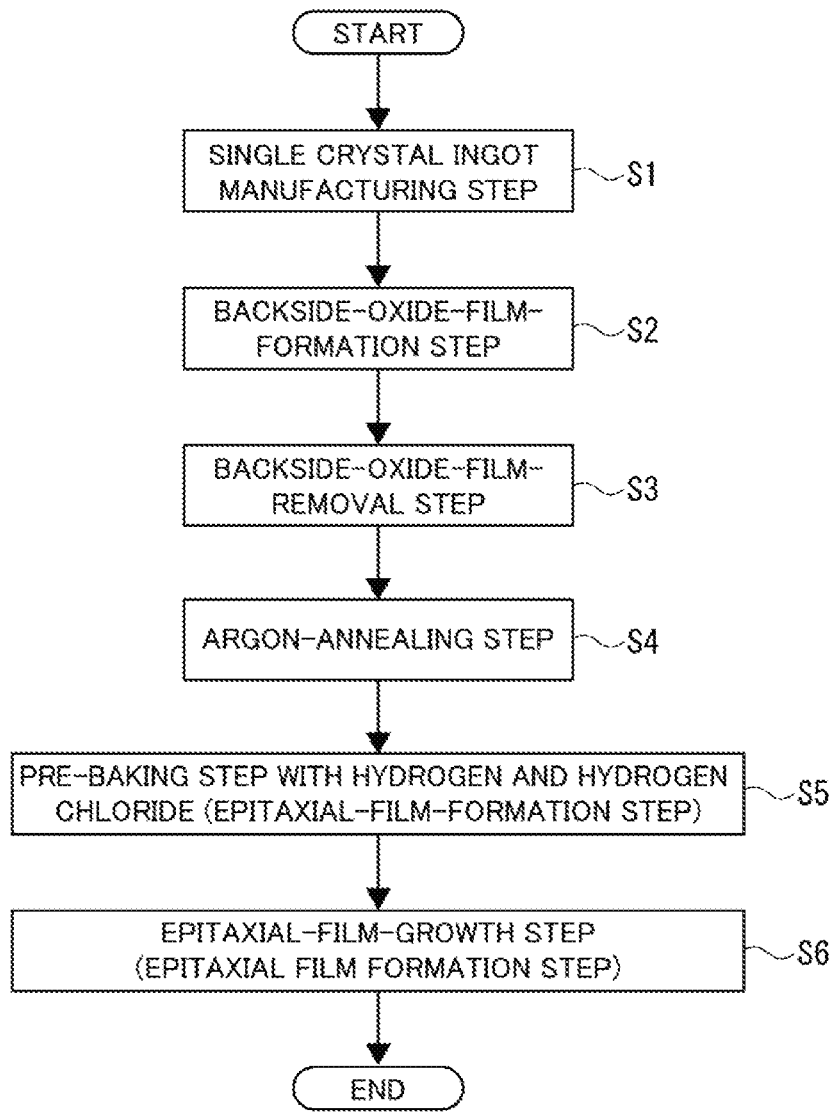

METHOD FOR MANUFACTURING EPITAXIAL SILICON WAFER

TECHNICAL FIELD

The present invention relates to a manufacturing method of an epitaxial silicon wafer.

BACKGROUND ART

Epitaxial silicon wafers for power MOS transistors, for instance, are required to have extremely low substrate resistivity. In order to sufficiently lower the substrate resistivity of silicon wafers, it is known to dope molten silicon with an n-type dopant for resistivity adjustment (e.g. arsenic (As) and antimony (Sb)) during a pull-up step (i.e. in growing silicon crystal) of a single crystal ingot for providing silicon wafers (referred to as a single crystal ingot hereinafter). However, since such dopants are extremely volatile, it is difficult to sufficiently increase the dopant concentration in the silicon crystals. Thus, silicon wafers exhibiting desired sufficiently low resistivity is difficult to be manufactured.

Accordingly, silicon wafers with extremely low substrate resistivity have come to be used in which phosphorus (P) as an n-type dopant, which is less volatile than arsenic (As) and antimony (Sb), is doped at a high concentration (see, for instance, Patent Literatures 1 and 2).

Patent Literatures 1 and 2 disclose that, when an epitaxial film is grown on a silicon wafer having been densely doped with phosphorus, a number of stacking faults (abbreviated as "SF" hereinafter) are generated on the epitaxial film, the SF appearing on the surface of the silicon wafer in a form of steps to significantly deteriorate LPD (Light Point Defect) level on the surface of the silicon wafer. The reasons for the generation of SF are speculated as follows.

The silicon wafer having been doped with phosphorus is first heated, which results in formation of clusters (microprecipitates) of oxygen and phosphorus. Subsequently, the silicon wafer is subjected to a heat treatment in a hydrogen gas atmosphere (hereinafter referred to as "hydrogen baking") in order to remove a natural oxide film present on the surface of the silicon wafer. The clusters are preferentially etched to provide micropits by an etching effect of the hydrogen gas due to a difference in an etching rate between the outermost layer of the silicon wafer and the clusters. It is speculated that, when the silicon wafer provided with the micropits is subjected to an epitaxial growth, SF originating from the micropits are generated in the epitaxial film.

Accordingly, Patent Literature 1, which focuses on a correlation between the solidification rate and thermal hysteresis of a single crystal ingot and generation of SF, discloses a manufacturing method in which the generation of SF is restrained by regulating a period of time when the temperature of the single crystal ingot is in a range of 570±70 degrees C. during the pull-up step.

Further, Patent Literature 2 discloses a manufacturing method in which the generation of SF is restrained by subjecting, prior to the formation of an epitaxial film, a silicon wafer to a heat treatment in an argon gas atmosphere (hereinafter referred to as "subjected to an argon-annealing treatment") to make the clusters on the outer layer into a solid solution.

CITATION LIST

Patent Literature(s)

Patent Literature 1: WO 2014/175120
Patent Literature 2: JP 2014-11293 A

SUMMARY OF THE INVENTION

Problem(s) to be Solved by the Invention

The manufacturing method as disclosed in Patent Literature 1 may, however, require a complicated temperature regulation during the pull-up step of the single crystal ingot.

Further, it has been found that the manufacturing method as disclosed in Patent Literature 2, which may be used in order to meet a recent growing need for silicon wafers with a lower substrate resistivity, sometimes fails to sufficiently restrain the generation of SF on the manufactured epitaxial silicon wafers.

An object of the invention is to provide a manufacturing method of an epitaxial silicon wafer, the method capable of sufficiently restraining generation of SF in a simple manner irrespective of the use of a silicon wafer with an extremely low resistivity.

Means for Solving the Problem(s)

After vigorous studies, the inventors have reached the following findings.

First, since it has been proven that there is a correlation between the solidification rate and thermal hysteresis of a single crystal ingot and generation of SF as described in Patent Literature 1, the inventors conducted experiments to examine the influence of the resistivity of the single crystal ingot on the correlation.

Experiment 1: Study on Correlation Between Resistivity/Solidification Rate/Thermal Hysteresis of Single Crystal Ingot and Generated SF Number In a manufacturing process of a usual single crystal ingot, a step for forming a shoulder continuous with a seed crystal and having a gradually increasing diameter (shoulder-formation step), a step for forming a straight body continuous with the shoulder and having a substantially constant diameter (straight-body-formation step) and a step for forming a tail continuous with a lower end of the straight body and having a diameter gradually reduced to zero (tail-formation step) are performed. After the tail-formation step is completed, a step for cooling the single crystal ingot (cooling step) is performed and the single crystal ingot is taken out of a pull-up device.

Since the single crystal ingot experiences the above manufacturing process, it is deduced that the time elapsed after being pulled out of the dopant-added melt becomes shorter toward a lower end (bottom) of the single crystal ingot (i.e. as the solidification rate increases). Incidentally, the solidification rate refers to a ratio of pulled-up weight of the single crystal ingot relative to an initial charge weight of a dopant-added melt initially stored in a quartz crucible.

Initially, single crystal ingots of Experimental Examples 1 and 2 were manufactured according to the above manufacturing process and a residence time at 570±170 degrees C. for each of the solidification rates was measured as a thermal hysteresis. To manufacture the single crystal ingots of Experimental Examples 1 and 2, red phosphorus (dopant) was added to the silicon melt to provide the dopant-added melt such that the substrate resistivity of silicon wafers became as shown in Table 1 below. Incidentally, a charge amount of the dopant-added melt was set at 100 kg as in a usual manufacturing process.

TABLE 1

|  | Top | Bottom |
|---|---|---|
| Experimental Example 1 | 1.1 mΩ · cm | 0.7 mΩ · cm |
| Experimental Example 2 | 0.9 mΩ · cm | 0.6 mΩ · cm |

In addition, silicon wafers corresponding to the plurality of solidification rates were cut out from the single crystal ingots of Experimental Examples 1 and 2 to manufacture epitaxial silicon wafers, and the SF number of each of the epitaxial silicon wafers was counted. FIG. 1 shows the results of Experimental Example 1 and FIG. 2 shows the results of Experimental Example 2. Incidentally, the SF number means the counted number of LPDs (Light Point Defects) of a size of 90 nm or more observed on a surface of each epitaxial silicon wafer when the surface was measured with a surface inspection system (DCN mode of SP-1 manufactured by KLA-Tencor Corporation).

It should be noted that the results in FIGS. 1 and 2 show the SF number counted on an epitaxial film formed under the following conditions on the silicon wafers provided with no polysilicon film on a backside thereof, the silicon wafers having been subjected to a hydrogen baking treatment in which the silicon wafers were heated at a temperature of 1200 degrees C. in a hydrogen gas atmosphere for 30 seconds.

Epitaxial Film Growth Conditions
Dopant gas: phosphine ($PH_3$) gas
Material source gas: trichlorosilane ($SiHCl_3$) gas
Carrier gas: hydrogen gas
Growth temperature: 1080 degrees C.
Thickness of epitaxial film: 4 μm
Resistivity (epitaxial film resistivity): 0.3 Ω·cm As shown in FIG. 1, it has been found in Experimental Example 1 that the SF number substantially correlates with the residence time of the single crystal ingot at the temperature of 570±70 degrees C. and the SF number becomes zero at a section where the solidification rate is more than 70%. In contrast, it has been found in Experimental Example 2 that, while the SF number substantially correlates with the residence time of the single crystal ingot at the temperature of 570±70 degrees C. at a section where the solidification rate is 75% or less, the SF number increases toward the bottom at a section where the solidification rate exceeds 75% irrespective of the residence time. Incidentally, the substrate resistivity at a position where the solidification rate was 75% was approximately 0.7 mΩ·cm.

In view of the above, it has been found that SF increases, irrespective of a shortened residence time at the temperature of 570±70 degrees C., in proportion to an increase in the concentration of the red phosphorus when the concentration of the red phosphorus is equal to or higher than a predetermined level, or in proportion to a reduction in the substrate resistivity when the substrate resistivity is equal to or lower than a predetermined level.

Experiment 2: Study on Effectiveness of Heat Treatment in Gas Atmosphere Containing Hydrogen and Hydrogen Chloride for Reducing SF It is believed that micropits generated after the hydrogen baking treatment need to be reduced in order to reduce the number of SF. In order to reduce the micropits, it is believed that a treatment for eliminating clusters has to be applied before the hydrogen baking treatment in which the clusters have been generated.

Accordingly, it has been examined whether or not SF can be reduced by etching a cluster-containing outer layer with a predetermined thickness of a silicon wafer with the use of a hydrogen chloride gas in addition to a hydrogen gas for a pre-baking treatment prior to the growth of an epitaxial film.

First, a single crystal ingot manufactured under the same conditions as in Experimental Example 2 was prepared. A plurality of silicon wafers were cut out from the single crystal ingot at each of a middle section where the number of SF is the largest in the single crystal ingot and a bottom section where the number of SF increases toward the bottom.

The substrate resistivity at the middle section was more than 0.7 mΩ·cm but not more than 0.9 mΩ·cm and the substrate resistivity at the bottom section was not more than 0.7 mΩ·cm. It should be noted that the middle section is, for instance, a section with a solidification rate ranging from 50% to 60% in FIG. 2 and the bottom section is a section with a solidification rate of 75% or more in FIG. 2.

Next, the silicon wafers cut out from the middle section and the bottom section were subjected to treatments as shown in Tables 2 and 3 to manufacture epitaxial silicon wafers of Experimental Examples 3 to 8, and the number of SF were evaluated. FIG. 3 shows the results of Experimental Examples 3 to 5 and FIG. 4 shows the results of Experimental Examples 6 to 8. It should be noted that an epitaxial film was grown under the same conditions as in Experimental Examples 1 and 2. It should also be noted that the argon-annealing treatment and the pre-baking treatment were performed with no polysilicon film provided on the backside of the silicon wafers.

TABLE 2

|  | Argon Annealing A: performed B: not performed | Pre-baking | Section for Cutting Silicon Wafer |
|---|---|---|---|
| Experimental Example 3 | B | Hydrogen | Middle |
| Experimental Example 4 | A | Hydrogen |  |
| Experimental Example 5 | A | Hydrogen + Hydrogen Chloride |  |
| Experimental Example 6 | B | Hydrogen | Bottom |
| Experimental Example 7 | A | Hydrogen |  |
| Experimental Example 8 | A | Hydrogen + Hydrogen Chloride |  |

TABLE 3

|  | Atmosphere | Heat Treatment Temperature | Heat Treatment Time |
| --- | --- | --- | --- |
| Argon Annealing | Argon Gas | 1200° C. | 30 mins |
| Pre-baking (Hydrogen) | Hydrogen Gas (FL: 40 L/min) | 1200° C. | 30 secs |
| Pre-baking (Hydrogen + Hydrogen Chloride) | Hydrogen Gas (FL: 40 L/min) Hydrogen Chloride (FL: 1 L/min) | 1190° C. | 30 secs |

The results shown in FIGS. 3 and 4 prove the following.

First, when the Experimental Example 3 is compared with Experimental Example 6, it is found that the middle section has more SF than the bottom section.

It is believed that is because the cluster density of the middle section is higher than that of the bottom section due to the influence of a thermal hysteresis during manufacturing the single crystal ingot.

Next, when Experimental Examples 3 and 6 are compared with Experimental Examples 4 and 7, it is found that the silicon wafers having been subjected to the argon-annealing treatment have less SF both at the middle section and the bottom section than the silicon wafers not having been subjected to the argon-annealing treatment.

The following reasons are conceived. First, as described in Patent Literature 2, the clusters present on the outer layer with the predetermined thickness are made into a solid solution to be reduced by the argon-annealing treatment. Accordingly, it is supposed that the number of the clusters present on the outer layer is reduced after a pre-baking treatment is performed in a hydrogen gas atmosphere subsequently to an argon-annealing treatment as compared with an instance without performing the argon-annealing treatment, which results in reducing the number of micropits generated after the pre-baking treatment and, consequently, reducing SF.

Further, when Experimental Example 4 is compared with Experimental Example 7, it is found that the bottom section has less SF than the middle section. Specifically, when the argon-annealing treatment was performed, the number of SF fell in a range from 0.1 per square centimeter to 1.0 per square centimeter at the middle section of Experimental Example 4 and the number of SF fell below 0.1 per square centimeter at the bottom section of Experimental Example 7.

It is believed that is because the middle section has a higher cluster density than the bottom section before the argon-annealing treatment and thus the number of the clusters remaining on the outer layer at the middle section after the argon-annealing treatment is larger even though the clusters are made into a solid solution by the argon-annealing treatment, which results in an increase of SF originating from the clusters.

Further, when Experimental Examples 4 and 7 are compared with Experimental Examples 5 and 8, it is found that the number of SF obtained after performing a pre-baking treatment in a gas atmosphere containing hydrogen and hydrogen chloride (referred to as "a pre-baking treatment with hydrogen and hydrogen chloride") is smaller both at the middle section and bottom section than that of SF obtained after performing a pre-baking treatment in a gas atmosphere containing hydrogen only (i.e., referred to as "a pre-baking treatment with hydrogen only").

The following reasons are conceived. First, in the pre-baking treatment with hydrogen only, the clusters present on the outermost layer of the silicon wafer are preferentially etched to become eminently observable as surface pits. In contrast, in the pre-baking treatment with hydrogen and hydrogen chloride, not only the clusters but also the outermost cluster is etched. Accordingly, it is supposed that the pre-baking treatment with hydrogen and hydrogen chloride reduces the number of micropits generated after the pre-baking treatment as compared with the pre-baking treatment with hydrogen only and, consequently, reduces the number of SF.

Further, when Experimental Example 5 is compared with Experimental Example 8, it is found that the pre-baking treatment with hydrogen and hydrogen chloride reduces the SF at the middle section to a level comparable to the SF at the bottom section. Specifically, when the pre-baking treatment was performed with hydrogen and hydrogen chloride, the number of SF was 0.02 per square centimeter or less both at the middle section and bottom section.

It is believed that is because the number of micropits present on the outer layer after the pre-baking treatment becomes the same as long as the outer layer where the clusters are made into a solid solution through the argon-annealing treatment has substantially an even thickness irrespective of the cluster density and an allowance of the outer layer to be etched by the pre-baking treatment is smaller than the thickness of the outer layer where the clusters are made into a solid solution through the argon-annealing treatment.

Incidentally, the number of SF at the middle section, which is the largest in the single crystal ingot, can be reduced to 0.02 per square centimeter or less by the pre-baking treatment with hydrogen and hydrogen chloride, so that the number of SF on a silicon wafer cut out from any other section in the single crystal ingot is supposed to be reduced to a similar level by such a pre-baking treatment.

The invention has been reached based on the above findings.

According to an aspect of the invention, a manufacturing method of an epitaxial silicon wafer including a silicon wafer doped with phosphorus and an epitaxial film provided on a surface of the silicon wafer, the method includes: forming an oxide film on a backside of the silicon wafer cut out from a single crystal ingot prepared by a Czochralski process; removing the oxide film present at an outer periphery of the silicon wafer; argon annealing in which the silicon wafer is subjected to a heat treatment in an argon gas atmosphere after the removing of the oxide film; and forming the epitaxial film on the surface of the silicon wafer after the argon annealing, the forming of the epitaxial film including: pre-baking in which the silicon wafer is subjected to a heat treatment in an gas atmosphere containing hydrogen and hydrogen chloride to etch an outer layer of the silicon wafer; and growing the epitaxial film on the surface of the silicon wafer after the pre-baking.

According to the above aspect of the invention, generation of SF can be sufficiently restrained in such a simple manner as additionally using a hydrogen chloride gas for a typical pre-baking treatment with hydrogen only irrespective of the use of a silicon wafer with an extremely low resistivity.

Example 3: Study on Correlation Between Allowance of Outer Layer for Pre-Baking Treatment with Hydrogen and Hydrogen Chloride/Growth Temperature of Epitaxial Film and Generated SF Number The allowance of an outer layer to be taken by the pre-baking treatment with hydrogen and hydrogen chloride may be larger than the thickness of an outer layer where clusters are made into a solid solution by the argon-annealing treatment. Such a new outer layer formed after the pre-baking treatment has clusters not having been made into a solid solution by the argon-annealing treatment and such clusters may be preferentially etched to form micropits, from which SF is generated.

Accordingly, an experiment was performed to determine an optimum value of the allowance of the outer layer to be taken by the pre-baking treatment with hydrogen and hydrogen chloride. Additionally, another experiment was also performed to determine an optimum value of the growth temperature of the epitaxial film.

First, silicon wafers manufactured under the same conditions as in Experimental Example 3, i.e., a plurality of silicon wafers cut out from the middle section of the single crystal ingot in the same manner as in Experimental Example 2, were subjected to the argon-annealing treatment under the same conditions as in Experimental Example 5.

Next, the heat treatment time, the heat treatment temperature, the concentration of the hydrogen chloride gas and the like were adjusted to prepare silicon wafers having outer layers with an allowance of 50 nm, silicon wafers having outer layers with an allowance of 100 nm, silicon wafers having outer layers with an allowance of 150 nm, silicon wafers having outer layers with an allowance of 180 nm, silicon wafers having outer layers with an allowance of 290 nm and silicon wafers having outer layers with an allowance of 395 nm. It should also be noted that the argon-annealing treatment and the pre-baking treatment were performed with no polysilicon film provided on the backside of each silicon wafer.

Subsequently, an epitaxial film was grown on each of the silicon wafers having the above allowances under the same conditions as in Experimental Example 2 except that the growth temperature was set at 1060 degrees C., 1080 degrees C. and 1100 degrees C. to manufacture an epitaxial silicon wafer, and the number of SF was counted. The results are shown in FIG. 5.

As shown in FIG. 5, it has been found that, when an allowance is in a range from 100 nm to 300 nm, the number of SF becomes less than 0.1 per square centimeter irrespective of the growth temperature for the epitaxial film, which proves that generation of SF can be sufficiently restrained. Especially, it has been found that, when an allowance is 150±10 nm, the number of SF becomes less than 0.01 per square centimeter.

It is believed that is because an allowance less than 100 nm is smaller than a dimension in a depth direction of clusters present on the outer layer and thus all the clusters cannot be eliminated, which results in generation of micropits originating from the remaining clusters not having been eliminated.

In contrast, an allowance exceeding 300 nm is larger than the thickness of the outer layer where the clusters are made into a solid solution by the argon-annealing treatment and thus some of the clusters not having been made into a solid solution by the argon-annealing treatment remain on a new outer layer formed after the pre-baking treatment, which results in generation of micropits originating from the remaining clusters.

Further, as shown in FIG. 5, it has been found that, when an allowance is, for instance, in a range from 100 nm to 300 nm, the number of SF becomes less than 0.1 per square centimeter at the growth temperature for the epitaxial film of 100 degrees C. and becomes 0.06 per square centimeter or less at the growth temperature of 1080 degrees C. or 1060 degrees C.

Further, it has been found that, when an allowance is in a range from 100 nm to 200 nm, the number of SF becomes 0.03 per square centimeter or less at the growth temperature of the epitaxial film of 1080 degrees C. or 1060 degrees C.

In view of the above, in the manufacturing method of the epitaxial silicon wafer according to the above aspect of the invention, it is preferable that the outer layer to be etched in the pre-baking step has a thickness ranging from 100 nm to 300 nm.

In the manufacturing method of the epitaxial silicon wafer according to the above aspect of the invention, it is preferable that the heat treatment in the argon-annealing step is performed in the argon gas atmosphere at a temperature ranging from 1150 degrees C. to 1250 degrees C., and the heat treatment in the pre-baking step is performed in the gas atmosphere containing hydrogen and hydrogen chloride at a temperature ranging from 1050 degrees C. to 1250 degrees C.

In the manufacturing method of the epitaxial silicon wafer according to the above aspect of the invention, it is preferable that the epitaxial-film-growth step includes growing the epitaxial film at a temperature ranging from 1050 degrees C. to 1150 degrees C., especially at a temperature of 1080 degrees C. or less.

In the manufacturing method of the epitaxial silicon wafer according to the above aspect of the invention, it is preferable that the pre-baking step includes adding a hydrogen chloride gas to a hydrogen gas atmosphere with a temperature ranging from 1050 degrees C. to 1250 degrees C. to make the gas atmosphere containing the hydrogen and the hydrogen chloride.

It has been experimentally found that adding a hydrogen chloride gas to a hydrogen gas atmosphere with a temperature lower than 1050 degrees C. results in hazing the epitaxial silicon wafer. Further, adding a hydrogen chloride gas to a hydrogen gas atmosphere with a temperature higher than 1250 degrees C. causes warpage of the wafer due to a large heat stress and thus slip dislocation is disadvantageously likely to occur.

According to the above aspect of the invention, since the hydrogen chloride gas is added to the hydrogen gas atmosphere with a temperature ranging from 1050 degrees C. to 1250 degrees C., the haze of the epitaxial silicon wafer can be prevented and the occurrence of slip dislocation can be restrained.

In the manufacturing method of the epitaxial silicon wafer according to the above aspect of the invention, a resistivity of the silicon wafer is preferably 1.5 mΩ·cm or less, more preferably 1.1 mΩ·cm or less, especially preferably 0.98 mΩ·cm or less.

BRIEF DESCRIPTION OF DRAWING(S)

FIG. 6 is a flowchart showing a manufacturing method of an epitaxial silicon wafer according to an exemplary embodiment of the invention.

DESCRIPTION OF EMBODIMENT(S)

Figure 1:
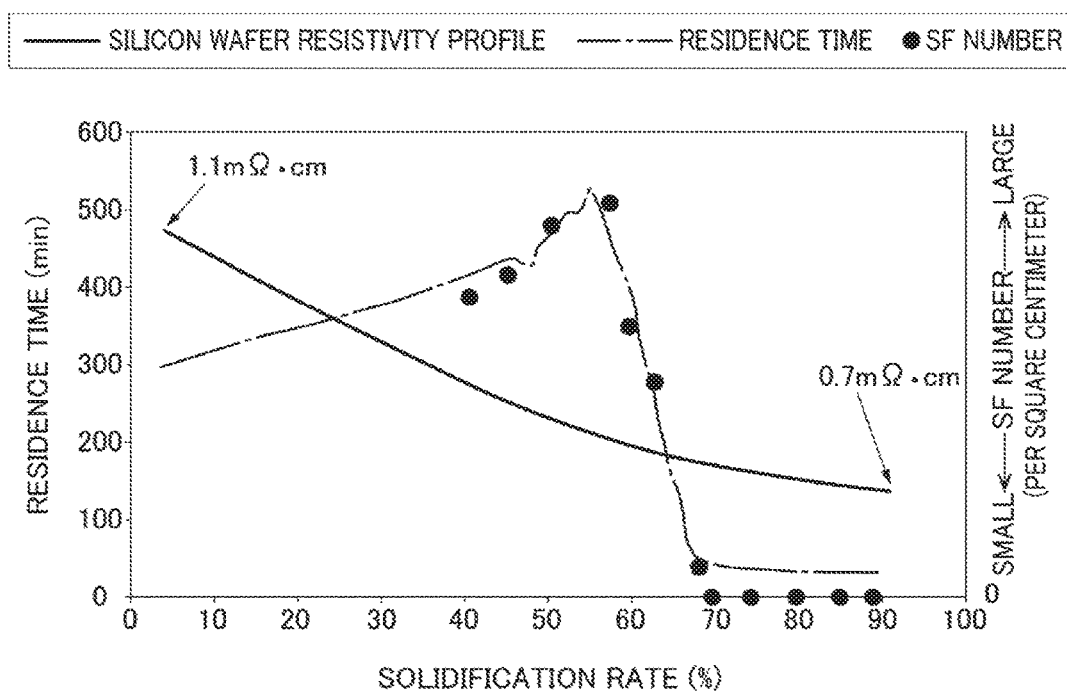
FIG. 1 is a graph of results of Experiment 1 for deriving a manufacturing condition of an epitaxial silicon wafer according to the invention, which shows a relationship between a solidification rate and a thermal hysteresis of a single crystal ingot and a generated SF number in Experimental Example 1.
Figure 2:
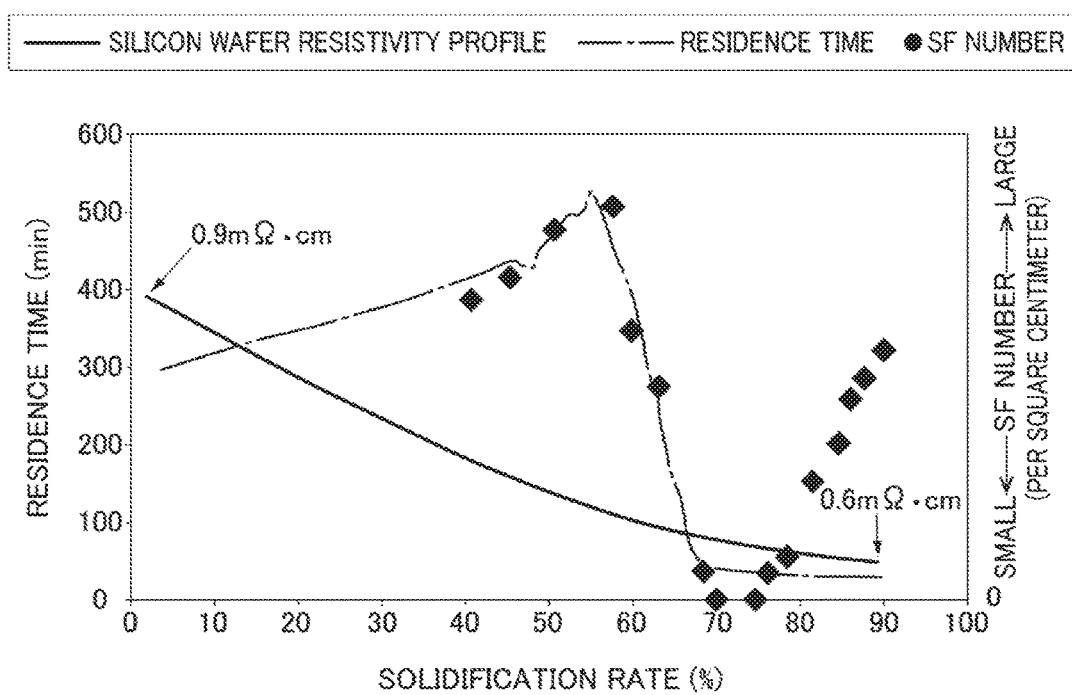
FIG. 2 is a graph of results of Experiment 1, which shows a relationship between a solidification rate and a thermal hysteresis of a single crystal ingot and a generated SF number in Experimental Example 2.
Figure 3:
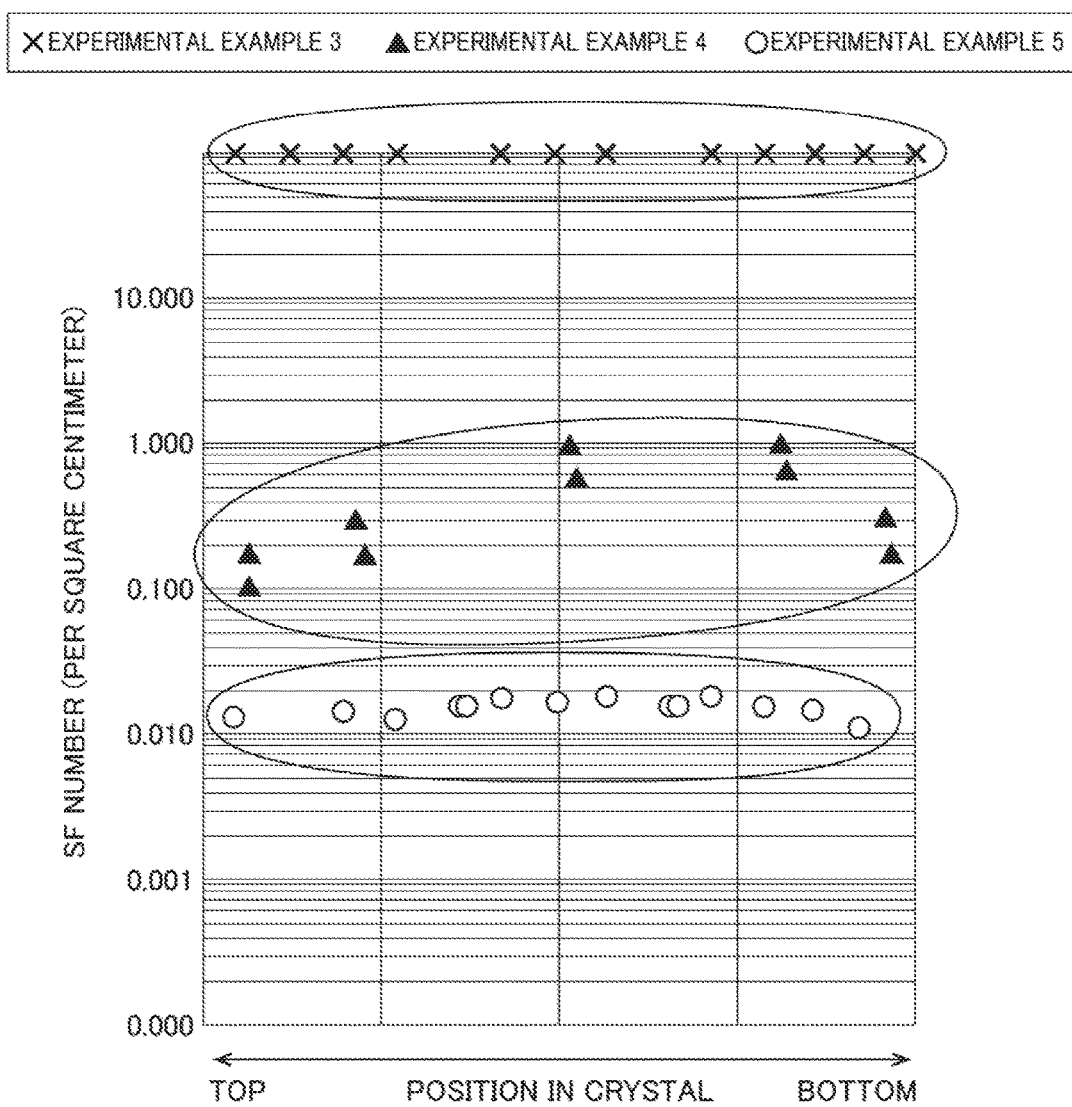
FIG. 3 is a graph of results of Experiment 2 for deriving the manufacturing condition, which shows relationships between a solidification rate of a single crystal ingot and a generated SF number in Experimental Examples 3 to 5.
Figure 4:
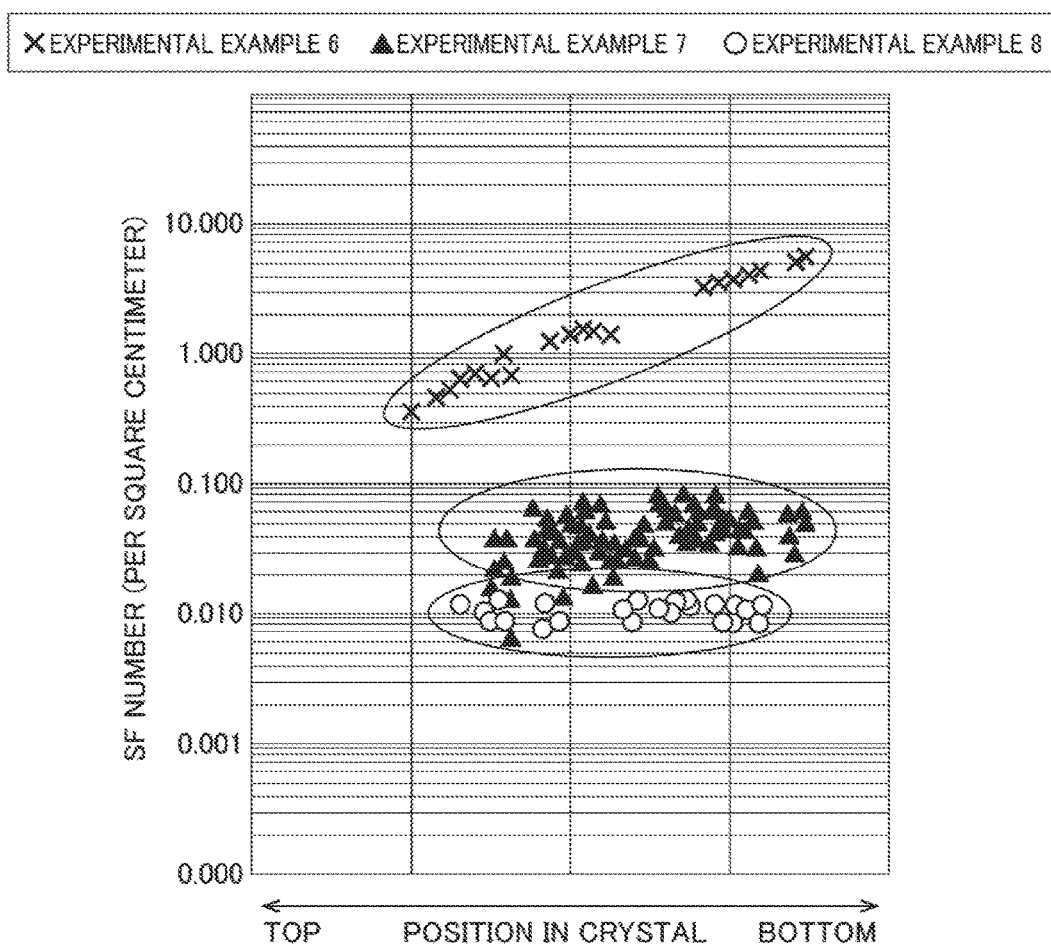
FIG. 4 is a graph of results of Experiment 2, which shows relationships between a solidification rate of a single crystal ingot and a generated SF number in Experimental Examples 6 to 8.
Figure 5:
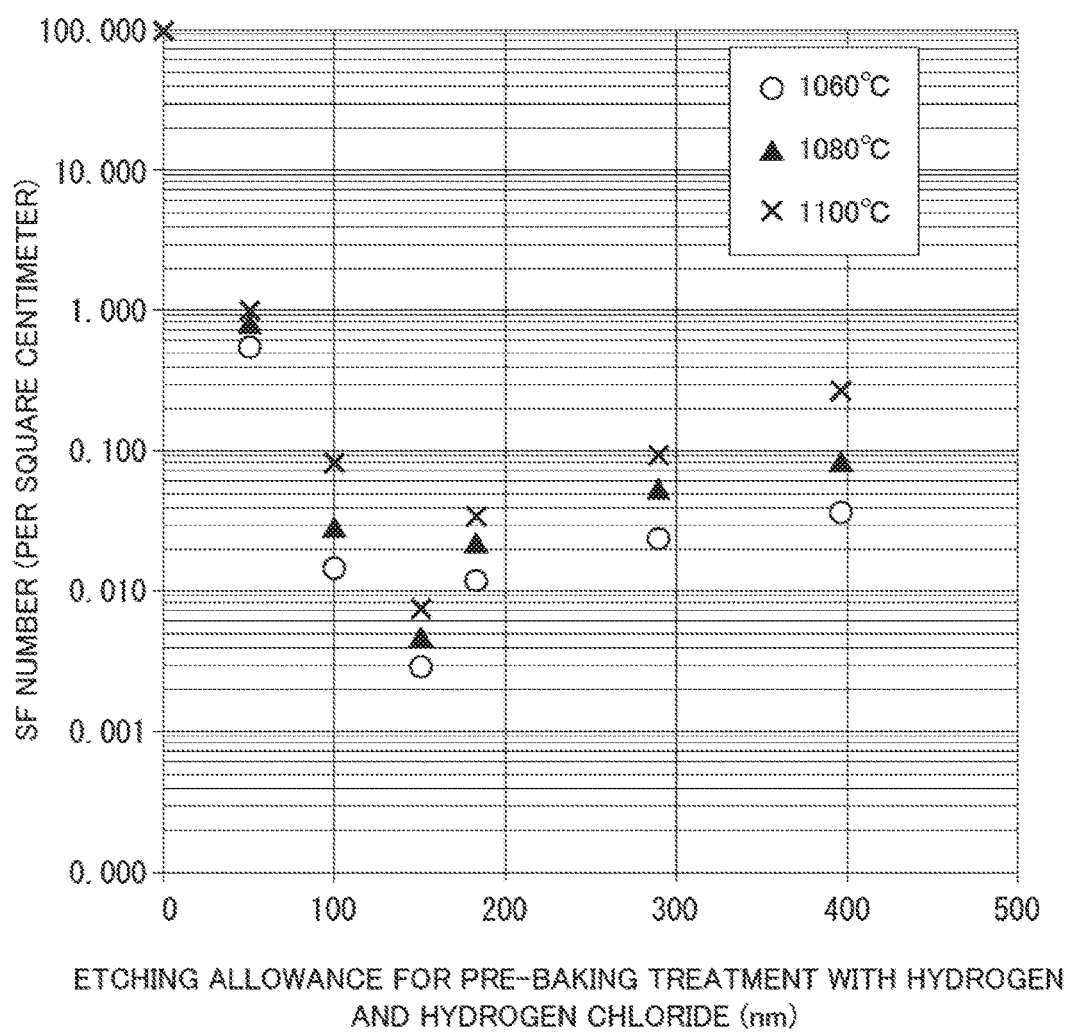
FIG. 5 is a graph of results of Experiment 3 for deriving the manufacturing condition, which shows a relationship between an etching allowance for a pre-baking treatment with hydrogen and hydrogen chloride and a generated SF number at each growth temperature for an epitaxial film.

Exemplary embodiment(s) of the invention will be described below with reference to the attached drawings.

As shown in FIG. 6, a single crystal ingot manufacturing step (step S1) is conducted in the manufacturing method of an epitaxial silicon wafer.

In the single crystal ingot manufacturing step, a single crystal ingot with a diameter of 200 mm is manufactured from a silicon melt added with red phosphorus (n-type dopant) according to CZ method (Czochralski process) using a pull-up device (not shown).

In this exemplary embodiment, the single crystal ingot is manufactured according to the following conditions so that the resistivity of silicon wafers cut out from the single crystal ingot falls in a range from 0.6 mΩ·cm to 0.98 mΩ·cm.

Red phosphorus concentration: $7.54 \times 10^{19}$ atoms/cm$^3$ or more and $1.32 \times 10^{20}$ atoms/cm$^3$ or less Oxygen concentration: $7 \times 10^{17}$ atoms/cm$^3$ or more and $12 \times 10^{17}$ atoms/cm$^3$ or less In order to restrain a misfit dislocation, germanium of a concentration in a range from $3.70 \times 10^{19}$ atoms/cm$^3$ to $2.93 \times 10^{20}$ atoms/cm$^3$ may be added.

Subsequently, silicon wafers are cut out from the single crystal ingot manufactured in step S1, and all the silicon wafers are subjected to a backside-oxide-film-formation step (step S2), a backside-oxide-film-removal step (step S3), an argon-annealing step (step S4), a pre-baking step performed in a gas atmosphere containing hydrogen and hydrogen chloride (epitaxial-film-formation step: step S5) and an epitaxial-film-growth step (epitaxial-film-formation step: step S6).

Specifically, in the backside-oxide-film-formation step of the step S2, a backside of each of the silicon wafers is subjected to a treatment according to the following conditions with a continuous normal-pressure CVD apparatus (AMAX1200 manufactured by Amaya Co., Ltd.) to form an oxide film (referred to as a backside oxide film hereinafter) on the backside of the silicon wafer.

Material gas: mixture gas of silane (SiH$_4$) and oxygen (O$_2$)

Thickness of the backside oxide film: 550 nm (in a range from 100 nm to 1500 nm)

Film-formation temperature: 430 degrees C. (in a range from 400 to 450 degrees C.)

The formation of the backside oxide film restrains the auto-doping.

In the backside-oxidation-film-removal step (step S3), the oxidation film present on the outer periphery of the backside of each of the silicon wafers is removed with the use of various methods including polishing and etching (see, for instance, JP 2003-273063 A and JP 2011-114210 A). The oxide film is preferably removed at an area less than 5 mm from an outer edge of each of the silicon wafers.

The removal of the backside oxide film at the outer periphery of each of the silicon wafers restrains the generation of so-called nodules.

In the argon-annealing step (step S4), a batch furnace capable of annealing a plurality of silicon wafers at a single time is used to apply a heat treatment according to the following conditions.

Atmosphere: argon gas

Heat treatment temperature: 1200 degrees C. to 1220 degrees C. (in a range from 1150 to 1250 degrees C.)

Heat treatment time: from 30 to 120 minutes

The argon-annealing step allows clusters generated on each of the silicon wafers to be made into a solid solution and reduced.

Incidentally, out-diffusion of red phosphorus is caused in the argon-annealing step to form an out-diffusion layer of a thickness in a range from 0.65 μm to 0.91 μm on the surface of each of the silicon wafers, thereby increasing a transition region width. However, since the red phosphorus moves from a high-concentration area to a low-concentration area due to a heat treatment(s) in the subsequent device production process, little problem occurs.

In the pre-baking step in a gas atmosphere containing hydrogen and hydrogen chloride (step S5), a heat treatment is applied on each of the silicon wafers in an epitaxial apparatus according to the following conditions.

Atmosphere: hydrogen gas and hydrogen chloride gas

Flow rate of hydrogen gas: 40 liters per minute

Flow rate of hydrogen chloride gas: 1 liters per minute

Heat treatment temperature: 1190 degrees C. (in a range from 1050 to 1250 degrees C.)

Heat treatment time: 30 seconds (in a range from 30 to 300 seconds)

Incidentally, to make the gas atmosphere containing hydrogen and hydrogen chloride in the pre-baking step, it is preferable that a temperature in an atmosphere containing a hydrogen gas only is first raised and a hydrogen chloride gas is added when the temperature reaches a range from 1050 degrees C. to 1250 degrees C. The addition of the hydrogen chloride gas at such a timing can prevent the haze of the epitaxial silicon wafer and restrain the occurrence of slip dislocation.

Further, an allowance of each of the silicon wafers for the pre-baking step is preferably in a range from 100 nm to 300 nm, more preferably 150±10 nm.

In the epitaxial-film-growth step (step S6), an epitaxial film is grown according to the following conditions on each of the silicon wafers having been subjected to the pre-baking step.

Dopant gas: phosphine (PH$_3$) gas

Material source gas: trichlorosilane (SiHCl$_3$) gas

Carrier gas: hydrogen gas

Growth temperature: 1060 degrees C. (in a range from 1050 to 1150 degrees C.)

Thickness of the epitaxial film: 4 μm (in a range from 1 μm to 10 μm)

Resistivity (epitaxial film resistivity): 0.3 Ω·cm (in a range from 0.01 to 10 Ω·cm)

Red phosphorus concentration: $1.87 \times 10^{16}$ atoms/cm$^3$ (in a range from $4.44 \times 10^{14}$ atoms/cm$^3$ to $4.53 \times 10^{18}$ atoms/cm$^3$)

With the epitaxial-film-growth step being performed, an epitaxial silicon wafer with an epitaxial film formed on the surface of each of the silicon wafers can be manufactured.

The silicon wafers may have clusters before being subjected to the backside-oxide-film-formation step. Even in such a case, the outer layer with the predetermined thickness is etched as well as the clusters through the argon-annealing step and the pre-baking step in the gas atmosphere containing hydrogen and hydrogen chloride. The number of SF generated on the resulting epitaxial silicon wafers can thus be reduced in such a simple manner as additionally using the hydrogen chloride gas for a typical pre-baking treatment with hydrogen only as compared with silicon wafers subjected to the typical pre-baking treatment in a gas atmosphere containing hydrogen only. High-quality epitaxial silicon wafers can thus be manufactured in such a simple manner as additionally using the hydrogen chloride gas for the typical pre-baking treatment with hydrogen only.

In addition, since the argon-annealing step is performed after performing the backside-oxide-film-removal step, the out-diffusion of red phosphorus from the outer periphery uncovered by the backside oxide film can be promoted, thereby restraining the occurrence of auto-doping. Thus, the resistivity on the surface of the epitaxial film can be equalized.

Another Exemplary Embodiment(s)

It should be understood that the scope of the invention is not limited to the above-described exemplary embodiment(s) but various improvements and design alterations are possible as long as such improvements and alterations are compatible with the invention.

For instance, the manufacturing method of an epitaxial silicon wafer according to the invention may be applied to any silicon wafer with a resistivity exceeding 0.98 mΩ·cm (e.g., a resistivity of 1.5 mΩ·cm or less) as long as the silicon wafer is formed from a single crystal ingot doped with phosphorus.

Further, when the generated SF number obtained after the argon-annealing step and the pre-baking step with hydrogen only is predictable, the silicon wafers with a generated SF number equal to or more than an acceptable value may be subjected to the pre-baking step with hydrogen and hydrogen chloride after the argon-annealing step, while the silicon wafers with a generated SF number less than the acceptable value may be subjected to the pre-baking step with hydrogen only after the argon-annealing step. It should be noted that the generated SF number may be predicted based on the thermal hysteresis of the single crystal ingot or, alternatively, may be predicted based on an evaluation result obtained by a heat treatment for pit evaluation of an evaluation silicon wafer cut out at a predetermined position as described in Patent Literature 2.

The invention claimed is:

1. A manufacturing method of an epitaxial silicon wafer comprising a silicon wafer doped with phosphorus and an epitaxial film provided on a surface of the silicon wafer, the method comprising:

forming an oxide film on a backside of the silicon wafer cut out from a single crystal ingot prepared by a Czochralski process;

removing the oxide film present at an outer periphery of the silicon wafer;

argon annealing wherein the silicon wafer is subjected to a heat treatment in an argon gas atmosphere after the removing of the oxide film to make clusters present on an outer layer of the silicon wafer into a solid solution; and forming the epitaxial film on the surface of the silicon wafer after the argon annealing, the forming of the epitaxial film comprising:

pre-baking wherein the silicon wafer is subjected to a heat treatment in a gas atmosphere comprising hydrogen and hydrogen chloride to etch the outer layer of the silicon wafer so that an allowance of the outer layer of the silicon wafer is smaller than a thickness of the outer layer where the clusters are made into the solid solution in the argon annealing; and growing the epitaxial film on the surface of the silicon wafer after the pre-baking.

2. The manufacturing method of the epitaxial silicon wafer according to claim 1, wherein the outer layer to be etched in the pre-baking has a thickness ranging from 100 nm to 300 nm.

3. The manufacturing method of the epitaxial silicon wafer according to claim 1, wherein the heat treatment in the argon annealing is performed in the argon gas atmosphere at a temperature ranging from 1150 degrees C. to 1250 degrees C., and the heat treatment in the pre-baking is performed in the gas atmosphere comprising hydrogen and hydrogen chloride at a temperature ranging from 1050 degrees C. to 1250 degrees C.

4. The manufacturing method of the epitaxial silicon wafer according to claim 1, wherein the epitaxial film is grown at a temperature ranging from 1050 degrees C. to 1150 degrees C. in the growing of the epitaxial film.

5. The manufacturing method of the epitaxial silicon wafer according to claim 1, wherein a resistivity of the silicon wafer is 1.5 mΩ·cm or less.

* * * * *